(12) United States Patent
Okamoto et al.

(10) Patent No.: US 8,878,540 B2
(45) Date of Patent: Nov. 4, 2014

(54) ABNORMAL CONDITION DETECTION APPARATUS

(75) Inventors: Hajime Okamoto, Shizuoka (JP); Masashi Sekizaki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 1037 days.

(21) Appl. No.: 12/165,751

(22) Filed: Jul. 1, 2008

(65) Prior Publication Data

US 2009/0009178 A1 Jan. 8, 2009

(30) Foreign Application Priority Data

Jul. 4, 2007 (JP) ................................. 2007-175894

(51) Int. Cl.
*G01N 27/416* (2006.01)
*G01R 19/165* (2006.01)
*G01R 31/36* (2006.01)

(52) U.S. Cl.
CPC ...... *G01R 31/3658* (2013.01); *G01R 19/16542* (2013.01)
USPC ............ 324/433; 324/134; 324/135; 324/136

(58) Field of Classification Search
USPC ................................... 320/134–136; 324/433
See application file for complete search history.

(56) References Cited

U.S. PATENT DOCUMENTS

| | | | |
|---|---|---|---|
| 6,252,376 B1 | 6/2001 | Nakamura et al. | |
| 7,521,896 B2 | 4/2009 | Yudahira et al. | |
| 7,557,585 B2 | 7/2009 | Yudahira | |
| 7,710,120 B2 | 5/2010 | Yudahira et al. | |
| 2005/0242776 A1* | 11/2005 | Emori et al. | 320/116 |
| 2006/0001403 A1* | 1/2006 | Yudahira | 320/134 |
| 2007/0120529 A1 | 5/2007 | Ishikawa et al. | |
| 2007/0132457 A1 | 6/2007 | Okamoto et al. | |

FOREIGN PATENT DOCUMENTS

| | | |
|---|---|---|
| JP | 11-265733 | 9/1999 |
| JP | 2006-042591 | 2/2006 |
| JP | 2006-058285 | 3/2006 |

OTHER PUBLICATIONS

Machine Translation of JP 2004-282798.*
Office Action issued by the Japan Patent Office on Jan. 24, 2012 in corresponding Japanese Application No. JP 2007-175894 (4 pages).

* cited by examiner

*Primary Examiner* — Samuel Berhanu
(74) *Attorney, Agent, or Firm* — Finnegan, Henderson, Farabow, Garrett & Dunner, LLP

(57) ABSTRACT

A plurality of result signals are driven low when abnormal condition is detected and driven high when no abnormal condition is detected. Presence and absence of the abnormal conditions of different types are indicated in a predetermined sequence by high and low signal levels of the result signals. The voltage detecting circuits simultaneously output the result signals on corresponding branching lines connected to a main line of a communication line. An OR gate outputs a result signal on which the result signals output by the voltage detecting circuits are superimposed. When at least one of the result signals of the voltage detecting circuits is at a level indicative of the presence of the abnormal condition, the OR gate outputs on the main line the result signal having the level indicative of the abnormal condition.

4 Claims, 9 Drawing Sheets

US 8,878,540 B2

ABNORMAL CONDITION DETECTION APPARATUS

DESCRIPTION OF THE RELATED ART

1. Field of the Invention

This invention relates to an abnormal condition detection apparatus, and, in particular, an abnormal condition detection apparatus that detects an abnormal condition on a battery-pack-block basis for a battery pack with unit cells composed of a secondary cell.

2. Background of the Invention

A hybrid electric vehicle (HEV) with an engine and an electric motor has two batteries, i.e., a low-voltage battery of about 12 volts for starting the engine and a high-voltage battery for driving the electric motor. The high-voltage battery is provided with unit cells that are connected in series, such as nickel-metal hydride and lithium secondary cells.

The high-voltage battery, which is the battery pack as explained above, has battery blocks, each of which has a voltage detecting circuit. The voltage detecting circuit detects a voltage across the unit cells, and a result of detection is transmitted to a low-voltage microprocessor (i.e., a control unit) that controls the entire high-voltage battery. In addition, the voltage detecting circuit serves as an abnormal condition detection unit, and detects several types of abnormal condition such as those related to the voltage detecting circuit as such, battery charge, disconnection, and analog-to-digital conversion. The voltage detecting circuit transmits the result of detection to the low-voltage microprocessor.

The voltage detecting circuits are connected to the low-voltage microprocessor via a communication line which consists of a main line connected to the low-voltage microprocessor and branching lines connected to the main line. In order to transmit the results of detection output from the voltage detecting circuits to the low-voltage microprocessor without causing collision of data to be transmitted, the results of detection of the voltage detecting circuit IC are transmitted for example at different transmission timings or, as in a master-slave data transmission system, each of the voltage detecting circuits may transmit the results of detection upon receiving instruction from the low-voltage microprocessor requesting data transmission.

Such conventional data transmission methodology has a drawback of degraded quality of communications, for increased amount of data requires a higher communication speed. When the communications are made with a lower communication speed, required or desired amount of data may fail to be transmitted within a predetermined time.

For example, Japanese Patent Application Laid-Open Publication No. 2004-282798 discloses an abnormality detection device of battery pack that reduces data amount of the detection results that are output by each of the voltage detecting circuits. The abnormal condition detection apparatus 100 of the battery pack is, as shown in FIG. 9, has overcharge detection circuits (a1 to an), overdischarge detection circuits (b1 to bn), OR circuits 2, c1 to cn, AND circuits 3, d1 to dn, switches 4, e1 to en, a clock circuit 10, a photocoupler 20 for signal transmission, and an NPN transistor 30.

Operation of the abnormal condition detection apparatus 100 of the battery pack with the above configuration can be summarized as follows. When a clock signal output by the clock circuit 10 is driven high, all of the overcharge detection circuits a1 to an and the overdischarge detection circuits b1 to bn respectively detect the abnormal conditions of their own detection circuits. Also, with the clock signal driven high, the switches e1 to en select the AND circuits d1 to dn, and the switch 4 selects the AND circuit 3.

Each of the overcharge detection circuits a1 to an and the overdischarge detection circuits b1 to bn respectively outputs a signal that is driven low when the circuit abnormal condition is detected, and driven high when no abnormal condition has been detected. If any one of the above overcharge detection circuits a1 to an and the overdischarge detection circuit b1 to bn has output a low-level signal indicating occurrence of the abnormal condition, then the AND circuit 3 transmits a low-level signal indicating the abnormal condition to the low-voltage microprocessor (not shown) via the photocoupler 20.

Meanwhile, when a low-level clock signal is output by the clock circuit 10, the overcharge detection circuits a1 to an detect occurrence of overcharge for their corresponding unit cells s1 to sn, and the overdischarge detection circuits b1 to bn detect occurrence of overdischarge for their corresponding unit cells s1 to sn. When the clock signal is driven low, the switches e1 to en select the OR circuits c1 to cn, and the switch 4 selects the OR circuit 2.

The overcharge detection circuits a1 to an and the overdischarge detection circuits b1 to bn output a signal that is driven high when a cell abnormal condition, i.e., occurrence of either overcharge or overdischarge, has been detected, and is driven low when all the unit cells s1 to are in a normal condition. When any one of the overcharge detection circuits a1 to an and the overdischarge detection circuits b1 to bn outputs a high-level signal indicating abnormal condition, the OR circuit 2 transmits a high-level signal indicating the occurrence of abnormal condition to the low-voltage microprocessor (not shown) via the photocoupler 20. Thus, the signals output by the overcharge detection circuits a1 to an and the overdischarge detection circuits b1 to bn are superimposed on a signal that is transmitted by the AND circuit 3 and the OR circuit 2 to the low-voltage microprocessor (not shown) and reduces the data amount to be transmitted.

However, the abnormal condition detection apparatus 100 described above has a signal level (low level) indicating the circuit abnormal condition is different from a signal level (high level) indicating the cell abnormal condition. Consequently, the abnormal condition detection apparatus 100 can transmit signals indicating only two types of abnormality. In addition, the AND circuit 3 and the OR circuit 2 have to be provided on a per-abnormality-type basis. Such solution is not very cost effective.

SUMMARY OF THE INVENTION

In view of the foregoing background, an object of the present invention is to provide an abnormal condition detection apparatus that can transmit signals indicative of different types of the abnormal conditions from a plurality of abnormal condition detection units to a control unit while ensuring reduced amount of data to be transmitted and reduced manufacturing cost.

In order to solve the above identified problems, the abnormal condition detection apparatus of the present invention includes the abnormal condition detection units that are provided on each of corresponding battery blocks of a battery pack, detect different types of abnormal conditions in the corresponding battery blocks, and transmit result signals that are driven either low or high when the abnormal condition is detected and driven either high or low when no abnormal condition is detected. The result signals are output on a communication line consisting of a main line and branching lines. A logic gate, which is provided at a branchpoint where the branching lines are connected to the main line, outputs on the main line the result signal having the signal level indicative of presence of the abnormal condition when any one of the result signals that have been output by the abnormal condition detection units has the signal level indicative of the presence of the abnormal condition. A control unit receives the result signal output by the logic gate.

The logic gate provided at the branchpoint of the main line and the branching lines outputs the result signal indicating the presence of the abnormal condition when any one of the plurality of result signals sent by the abnormal condition detection units has the level indicative of the presence of the abnormal condition. Since the plurality of the result signals are superimposed upon the result signal output by the logic gate, the amount of data to be transmitted can be reduced when compared with transmission of all the result signals one at a time in a sequential manner. Also, by defining the signal levels indicating the presence and absence of abnormality that are equally applied irrespective of the types of the abnormal conditions, and the presence or absence of the abnormal conditions of the different types can be indicated by the result signals in a predetermined sequence in order of the types of abnormal conditions, results of detection of more than one type of abnormality can be sent to the control unit based upon the typology of the abnormal conditions, without providing logic gates such as the AND circuit and the OR circuit on a per-abnormal-condition-type basis.

Preferably, the abnormal condition detection apparatus according to the present invention employs the result signals that are driven low when the abnormal condition is detected and driven high when no abnormal condition is detected.

A waveform of the result signal can represent the different types of the abnormal conditions in a predetermined sequence in such a manner that the result signals as defined above shares only one combination of the high and low signal levels indicating the presence and the absence of the different types of the abnormal conditions. Thus, the results of detection of the abnormal conditions of more than one type can be sent to the control unit without providing an AND circuit or an OR circuit. Also, since the result signal is driven low when an abnormal condition has been detected, a low-level signal on which the result signals are superimposed can be output on the main line when any one of the result signals is driven low to indicate the presence of the abnormal condition, without providing logic gates such as the AND circuit and the OR circuit on the communication line. Thus, the amount of data to be transmitted can be reduced when compared with transmission of all the result signals in the sequential manner.

Preferably, the abnormal condition detection apparatus in the present invention is configured such that the plurality of abnormal condition detection units are only driven by power supplied from their corresponding unit cells of the battery blocks, and that the plurality of insulating interfaces are provided on each of the branching lines and configured to connect the plurality of abnormal condition detection unit and the control unit while insulating therebetween.

With the construction and arrangement described above, in order that the breakdown voltage of the device be lowered, in other words, only a required level of the breakdown voltage be given to the devices of the voltage detecting circuits, the abnormal condition detection units are driven by the power supplied from the unit cells of the corresponding battery blocks, and as a result the voltage levels of the result signals vary according to the abnormal condition detection units. However, by virtue of the insulating interfaces provided on the branching lines, the same voltage level can be shared by the result signals output on the branchpoint by the abnormal condition detection units.

BRIEF DESCRIPTION OF THE DRAWINGS

These and other objects, features, and advantages of the present invention will become more apparent upon reading of the following detailed description along with the accompanied drawings, in which.

DESCRIPTION OF THE PREFERRED EMBODIMENT

Figure 1:
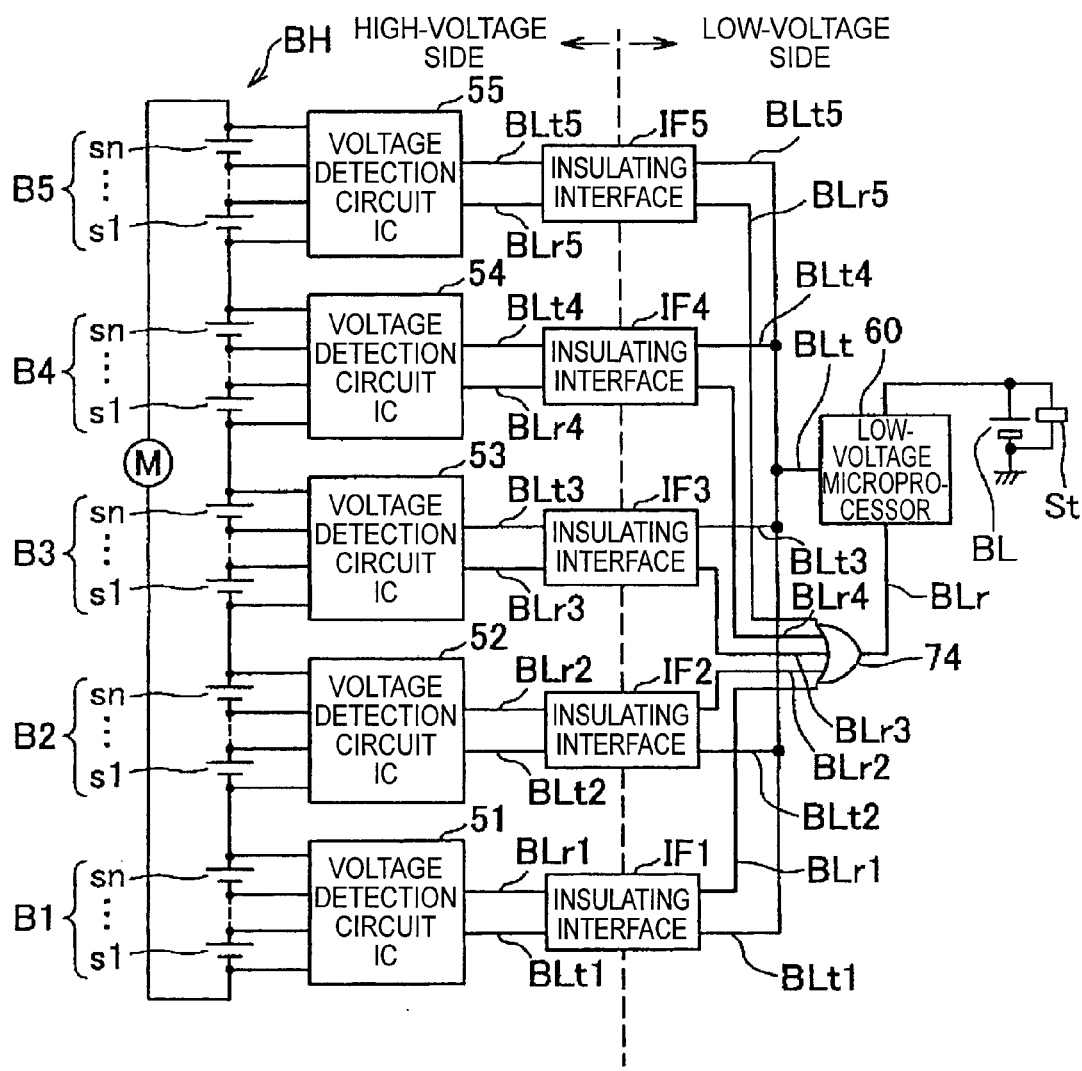
FIG. 1 is a circuit diagram illustrating one embodiment of a battery monitoring device incorporating an abnormal condition detection apparatus of the present invention.

FIG. 1 illustrates a battery monitoring device incorporating an abnormal condition detection apparatus in accordance with one embodiment of the present invention.

A low-voltage battery indicated by a reference sign "BL" in FIG. 1 may be a single secondary cell. The low-voltage battery BL serves as a power source for a starter St used to start an engine. Components such as an alternator (not shown) are connected as a battery charger to positive and negative terminals of the low-voltage battery BL.

A high-voltage battery indicated by a reference sign "BH" in FIG. 1 is a battery pack of the present invention. The high-voltage battery BH serves as a power source for an electric motor M of an HEV having the engine and the electric motor M as its driving sources. The electric motor M is connected as a load to positive and negative terminals of the high-voltage battery BH. Components such as an alternator (not shown) are connected as a battery charger to the positive and negative terminals of the high-voltage battery BH.

The high-voltage battery BH has for example five battery blocks B1 to B5. Each of the battery blocks B1 to B5 is made up of n unit cells s1 to sn (where n represents an integer). Each of the unit cells s1 to sn may be a single secondary cell.

The battery monitoring device has voltage detecting circuits IC51 to IC55 as an abnormal condition detection unit and a low-voltage microprocessor 60 as a control unit according to the present invention. The low-voltage microprocessor 60 is driven by the low-voltage battery BL, and controls the voltage detecting circuits IC51 to IC55.

The voltage detecting circuits IC51 to IC55 correspond to the blocks B1 to B5, respectively. The voltage detecting circuits IC51 to IC55 are only driven by power supplied from the unit cells s1 to sn of their corresponding blocks B1 to B5. The voltage detecting circuits IC51 to IC55 has different ground levels on the side of the negative terminals of the corresponding battery blocks B1 to B5. This configuration allows breakdown voltage of the devices of the voltage detecting circuits IC51 to IC55 to be lowered.

Figure 2:
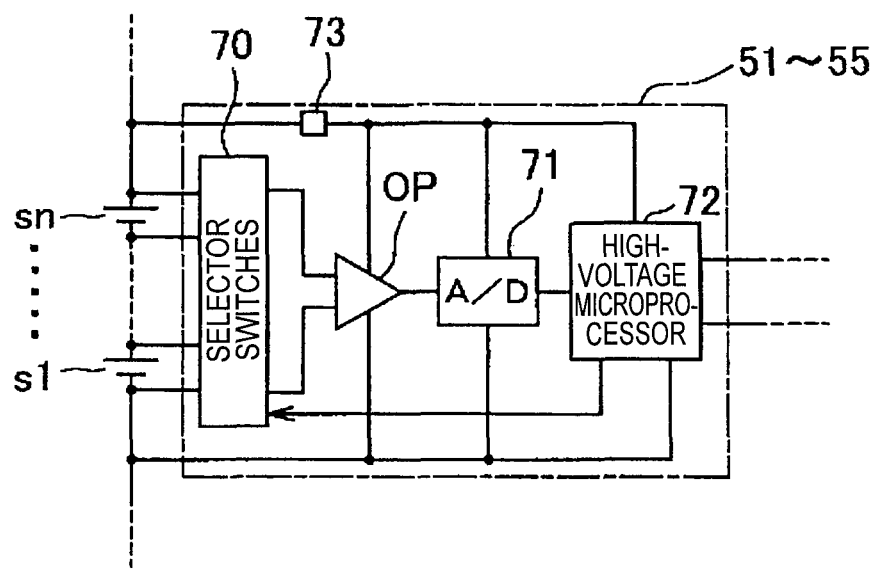
FIG. 2 is an electrical diagram illustrating in detail the configuration of the voltage detecting circuit IC of the battery monitoring device of FIG. 1.

Referring to FIG. 2, the voltage detecting circuits IC51 to IC55 respectively has (a) a differential amplifier OP that detects a voltage across the unit cells s1 to sn, (b) selector switches 70 that selectably connect positive and negative terminals of either one of the unit cells s1 to sn of the battery blocks B1 to B5 to the differential amplifier OP, (c) an analog-to-digital converter 71 for analog-to-digital conversion of the voltage across the unit cells s1 to sn that has been detected by the differential amplifier OP, and (d) a high-voltage microprocessor 72 that controls the selector switches 70.

Also, each of the voltage detecting circuits IC51 to IC55 has a high-voltage power supply circuit 73 that outputs constant voltage which is power source that drives the differential amplifier OP, the A/D converter 71, and the high-voltage microprocessor 72, on the basis of power supply by the corresponding battery blocks B1 to B5.

Referring again to FIG. 1, the voltage detecting circuits IC51 to IC55 are connected to the low-voltage microprocessor 60 via communication lines Lt and Lr.

The communication line Lt consists of a main line BLt connected to the low-voltage microprocessor 60, and branching lines BLt1 to BLt5 that branch from the main line BLt to be connected to the corresponding voltage detecting circuits IC51 to IC55. The communication line Lt is used to transmit signals from the low-voltage microprocessor 60 to the voltage detecting circuits IC51 to IC55.

The communication line Lr consists of a main line BLr connected to the low-voltage microprocessor 60 and branching lines BLr1 to BLr5 that branch from the main line BLr to be connected to the corresponding voltage detecting circuits IC51 to IC55. The communication line Lr is used to transmit signals from the voltage detecting circuits IC51 to IC55 to the low-voltage microprocessor 60.

Still referring to FIG. 1, insulating interfaces IF1 to IF5 are provided on the branching lines BLr1 to BLr5 and BLt1 to BLt5. The voltage detecting circuits IC51 to IC55 are electrically insulated from the side of the low-voltage microprocessor 60 by the insulating interfaces IF1 to IF5. At the same time, the voltage detecting circuits IC51 to IC55 are connected to the low-voltage microprocessor 60 via the insulating interfaces IF1 to IF5. The low-voltage microprocessor 60 and the voltage detecting circuits IC51 to IC55 can transmit data to and receive data from each other while being insulated from each other by the insulating interfaces IF1 to IF5. Thus, the high-voltage battery BH and the low-voltage battery BL are kept electrically insulated. The insulating interfaces IF1 to IF5 are a well known component such as a photocoupler (opto-isolator) having a light-emitting element and a light-receiving element, or a magnetic isolator. Also, an OR gate 74 as a logic gate is provided at a branchpoint where the branching lines BLr1 to BLr5 merge to be connected to the main line BLr.

Figure 3:
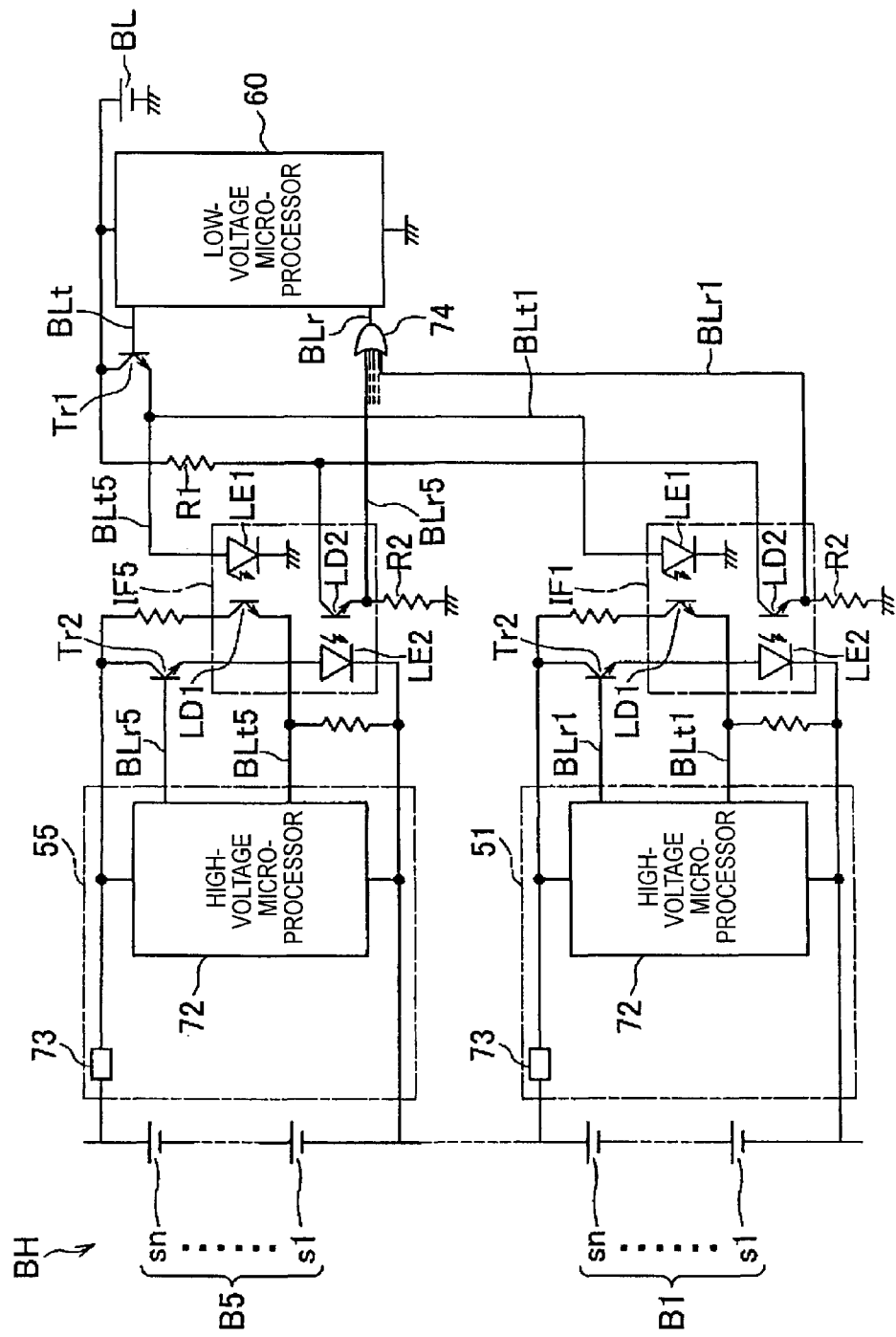
FIG. 3 is a circuit diagram of FIG. 1 where a photocoupler is used as an insulating interface.

Referring to FIG. 3, a photocoupler is used as the insulating interface. Note that FIG. 3 does not illustrate the voltage detecting circuits IC51 to IC55 for simplicity. As illustrated in FIG. 3, the insulating interfaces IF1 to IF5 include a light-emitting element LE1 on the low-voltage-driven side and a light-receiving element LD1 on the high-voltage-driven side. The power supplied by the low-voltage battery BL is supplied to each of the light-emitting element LE1 via the collector and the emitter of the transistor Tr1. A base of the transistor Tr1 is connected to the low-voltage microprocessor 60, and is turned on and off by the low-voltage microprocessor 60. When the low-voltage microprocessor 60 turns on the transistor Tr1, power is supplied to the light-emitting element LE1 and the light-emitting element LE1 emits light.

Meanwhile, the light-receiving element LD1 is connected to the unit cells s1 to sn of the corresponding battery block. The light-receiving element LD1 is turned on upon receiving the light from the light-emitting element LE1, and sends an electrical signal to the high-voltage microprocessor 72. The above configuration allows the electrical signal to be transmitted to the high-voltage microprocessor 72 while the high-voltage microprocessor 72 is kept electrically insulated from the low-voltage microprocessor 60. Evidently, the main line BLt is a line connecting the base of the transistor Tr1 to the low-voltage microprocessor 60 and, and the branching lines BLt1 to BLt5 consist of (a) a line connecting the emitter of the transistor Tr1 to the light-emitting elements LE1 and (b) a line connecting the light-receiving element LD1 to the high-voltage microprocessor 72.

Still referring to FIG. 3, the insulating interfaces IF1 to IF5 have a light-receiving element LD2 on the low-voltage-driven side and a light-emitting element LE2 on the high-voltage-driven side. Each of the light-emitting elements LE2 is powered by the unit cells s1 to sn of the corresponding battery blocks B1 to B5 via the collector and the emitter of the transistor Tr2. The base of the transistor Tr2 is connected to each of the high-voltage microprocessors 72, and is turned on and off by the high-voltage microprocessors 72. When the high-voltage microprocessor 72 turns on the transistor Tr2, power is supplied to the light-emitting element LE2 and the light-emitting element LE2 emits light.

Meanwhile, the light-receiving elements LD2 are connected, in parallel to each other, between the low-voltage battery BL and the ground. The light-receiving element LD2 is enabled upon receiving the light from the light-emitting element LE2, and supplies an electrical signal to the OR gate 74. This configuration allows a voltage signal from the high-voltage microprocessor 72 to be sent to the low-voltage microprocessor 60 while the high-voltage microprocessor 72 is kept insulated from the low-voltage microprocessor 60. Evidently, the main line BLr is a line connecting an output terminal of the OR gate 74 to the low-voltage microprocessor 60e 74, and the branching lines BLr1 to BLr5 consist of (a) lines connecting the light-receiving elements LD2 to input terminals of the OR gate 74 and, (b) lines connecting the light-emitting element LE2 to the high-voltage microprocessor 72.

Figure 4:
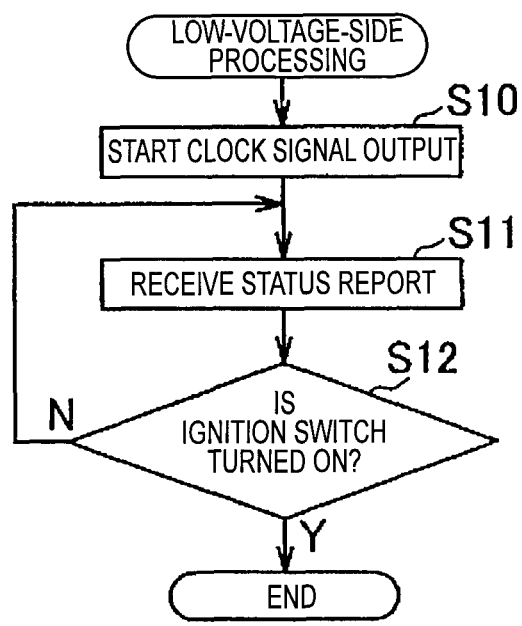
FIG. 4 is a flowchart illustrating a low-voltage-related procedure of the low-voltage microprocessor illustrated in FIG. 1.
Figure 5:
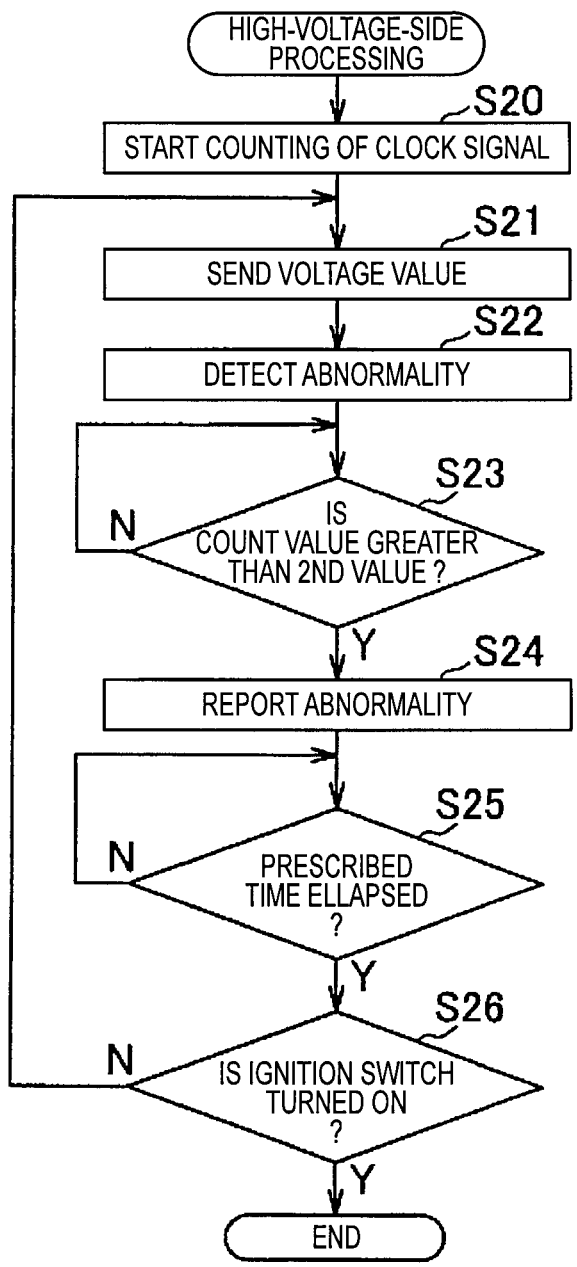
FIG. 5 is a flowchart illustrating a high-voltage-related procedure of the high-voltage microprocessor illustrated in FIG. 2.

The following paragraphs describe operation of the battery monitoring device with the above-described configuration with reference to the flowcharts of FIGS. 4 and 5.

Referring first to FIG. 4, the low-voltage microprocessor 60 starts low-voltage-related processing in response to whether an ignition switch (not shown) is turned on or off. In the low-voltage-related processing, the low-voltage microprocessor 60 provides a clock signal on the main line BLt (step S10). The clock signal output on the main line BLt is supplied via the branching lines BLt1 to BLt5 and the insulating interfaces IF1 to IF5 to each of the high-voltage microprocessors 72 of the voltage detecting circuits IC51 to IC55.

Referring to FIG. 5, the high-voltage microprocessor 72, which is a microprocessor driven by a high voltage, starts high-voltage-related processing based on the clock signal that has been received from the low-voltage microprocessor 60. In the high-voltage-related processing, the high-voltage microprocessor 72 starts counting of the clock signal using a timer (not shown) (step S20). Thereafter, the high-voltage microprocessor 72 transmits a signal indicative of a voltage value (step S21).

With respect to voltage value transmission, the high-voltage microprocessor 72 controls the selector switches 70 and selectably connects the positive and negative terminals of the corresponding unit cells s1 to sn of the battery blocks B1 to B5 one at a time to the differential amplifier OP. Thus, a digital value of the voltage across the unit cells s1 to sn are sent one at a time from the A/D converter 71 to the high-voltage microprocessor 72. Thereafter, when a count value of the clock signal exceeds a first predetermined value, the high-voltage microprocessor 72 sends the digital values of the voltage across the unit cells s1 to sn one at a time to the low-voltage microprocessor 60 with its own address designated. The first predetermined value varies according the voltage detecting circuits IC51 to IC55 so that the digital value of the voltage across the unit cells s1 to sn can be sent one at a time by each of the voltage detecting circuits IC51 to IC55. Also, the high-voltage microprocessor 72 outputs a low-level signal while the digital value of the voltage across the unit cells s1 to sn is not transmitted. For example, while the high-voltage microprocessor 72 of the voltage detecting circuit IC51 is sending the digital value of the voltage across the unit cells s1 to sn, the high-voltage microprocessors 72 of the voltage detecting circuit IC52 to IC55 output the low-level signals. Thus, the digital value of the voltage across the unit cells s1 to sn sent by the high-voltage microprocessor 72 of the voltage detecting circuit IC51 can pass through the OR gate 74.

Next, on the basis of information such as the voltage across the unit cells s1 to sn detected by the voltage value transmission, the high-voltage microprocessor 72 performs abnormal condition detection of, for example, four types of abnormal condition, i.e., abnormal conditions related to charging, IC as such, disconnection, and analog-to-digital conversion (step S22).

Thereafter, when the count value of the clock signal is larger than a second predetermined value, i.e., when "Yes" results in step S23, the high-voltage microprocessor 72 performs abnormal condition report, i.e., sends a result signal indicative of the result of the abnormal condition detection to the low-voltage microprocessor 60 (step S24). It should be noted that the same second predetermined value applies to all of the high-voltage microprocessors 72 so that the voltage detecting circuits IC51 to IC55 simultaneously output the result signals.

Figure 6:
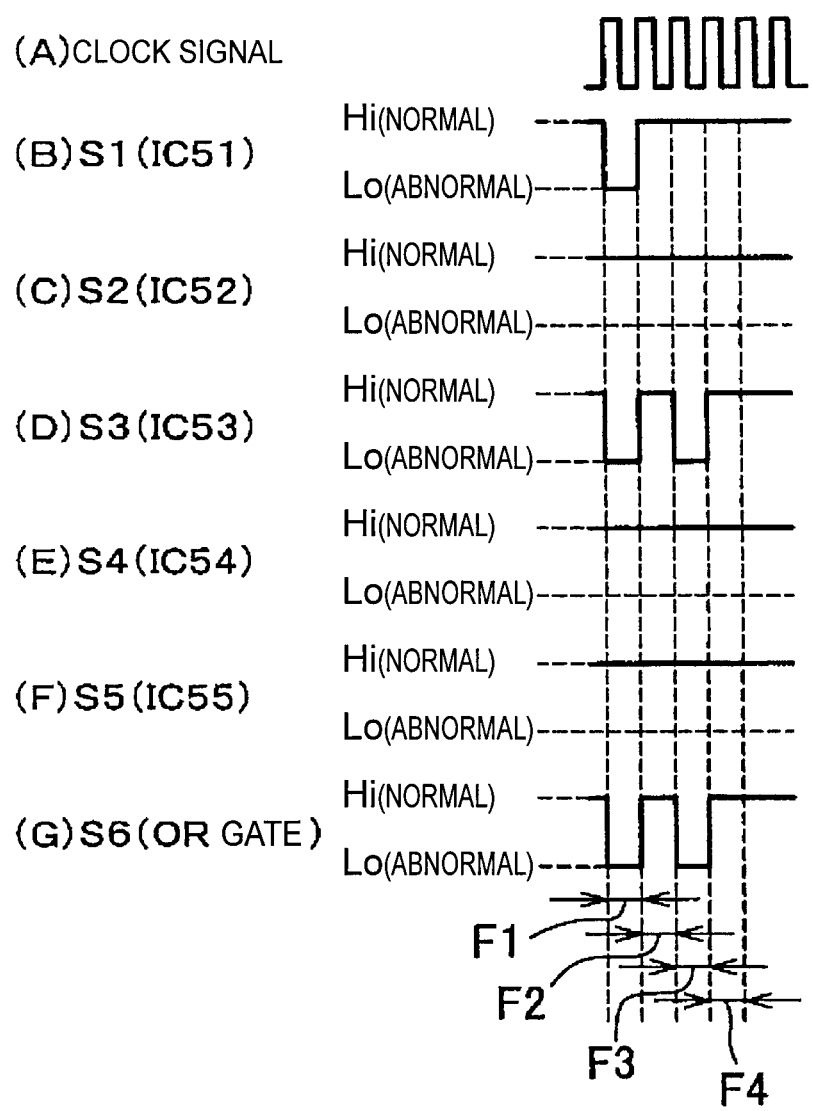
FIG. 6 is a timing chart of a clock signal, result signals output by the voltage detecting circuits, and a result signal output by an OR gate 74.

Referring now to FIG. 6, the abnormal condition report processing involves four flags F1 to F4 to detect different types of the abnormal conditions; F1 indicates occurrence of the abnormal condition related to battery charge; F2 is used to indicate any abnormal condition occurring in the voltage detecting circuit as such; F3 indicates occurrence of disconnection; and F4 indicates any abnormal condition related to analog-to-digital conversion.

Still referring to FIG. 6, the result signals S1 to S5 indicative of the four flags F1 to F4 one following the other are output by the high-voltage microprocessors 72 on the branching lines BLr1 to BLr2. Each of the flags F1 to F4 that indicate the presence and absence of the abnormal conditions will be at its low or high level corresponding to the signals that are driven low when the abnormal condition has been detected and are driven and kept high when no abnormal condition has been detected.

Here, a high-level signal corresponds to a base voltage at which the transistor Tr2 of FIG. 3 is turned on and the light-emitting element LE2 of the insulating interfaces IF1 to IF5 emits light. When the light-emitting element LE2 emits light, the light-receiving element LD2 is turned on and the high-level result signals S1 to S5 with a high level obtained by dividing the voltage of the low-voltage battery BL by resistors R1 and R2 are simultaneously input to the OR gate 74.

Meanwhile, a low-level signal corresponds to a base voltage at which the transistor Tr2 is turned off so that the light-emitting element LE2 of the insulating interfaces IF1 to IF5 does not emit light. If the light-emitting element LE2 does not emit light, the result signals S1 to S5 at low level, at which the light-receiving element LD2 is turned off to be at a ground potential, are simultaneously input to the OR gate 74.

The result signals S1 to S5 are simultaneously input to the OR gate 74.

Firstly, when at least one of the result signals S1 to S5 contains the low-level flag F1, the OR gate 74 outputs on the main line BLr the flag F1 indicative of the presence of abnormal condition related to battery charge. In the example of FIG. 6, the voltage detecting circuits IC51 and IC53 output the result signals S1 and S3 that are driven low with the low-level flag F1, and therefore the OR gate 74 outputs a result signal S6 that contains the low-level flag F1.

Secondly, when at least one of the result signals S1 to S5 is driven low with the low-level flag F2, the OR gate 74 outputs on the main line BLr the result signal S6 that contains the low-flag F2. In the example of FIG. 6, all of the voltage detecting circuits IC51 to IC55 output the result signals that are driven or kept high with the high-level flags F2, and therefore the OR gate 74 outputs the result signal S6 that is driven high so as to indicate the high-level flag F2.

Thirdly, when at least one of the result signals S1 to S5 is driven low with the low-level flags F3, the OR gate 74 outputs on the main line BLr the result signal S6 that has been driven low with the low-level flag F3. In the example of FIG. 6, the voltage detecting circuit IC53 outputs the result signal S3 that has been driven low so as to indicate the low-level flag F3, and therefore the OR gate 74 outputs the result signal that has been driven low so as to indicate the low-level flag F3.

Finally, when at least one of the result signals S1 to S5 is driven low with the low-level flag F4, the OR gate 74 outputs on the main line BLr the result signal S6 with the low-level flag F4. In the example of FIG. 6, all of the voltage detecting circuits IC51 to IC55 output the result signals that has been driven high with the high-level flags F4, and therefore the OR gate 74 outputs the result signal S6 that has been driven high so as to indicate the high-level flag F4.

As illustrated by (G) of FIG. 6, sending a result signal S6 on which the result signals S1 to S5 are superimposed to the low-voltage microprocessor 60 is not enough to identify which one of the voltage detecting circuits IC51 to IC55 is affected by the abnormal condition. Nevertheless, transmission of information of only four bits to the low-voltage microprocessor 60 allows detection of the presence of the abnormal conditions (F1 and F3 in the example of FIG. 6) in either one of the voltage detecting circuits IC51 to IC55.

Figure 7:
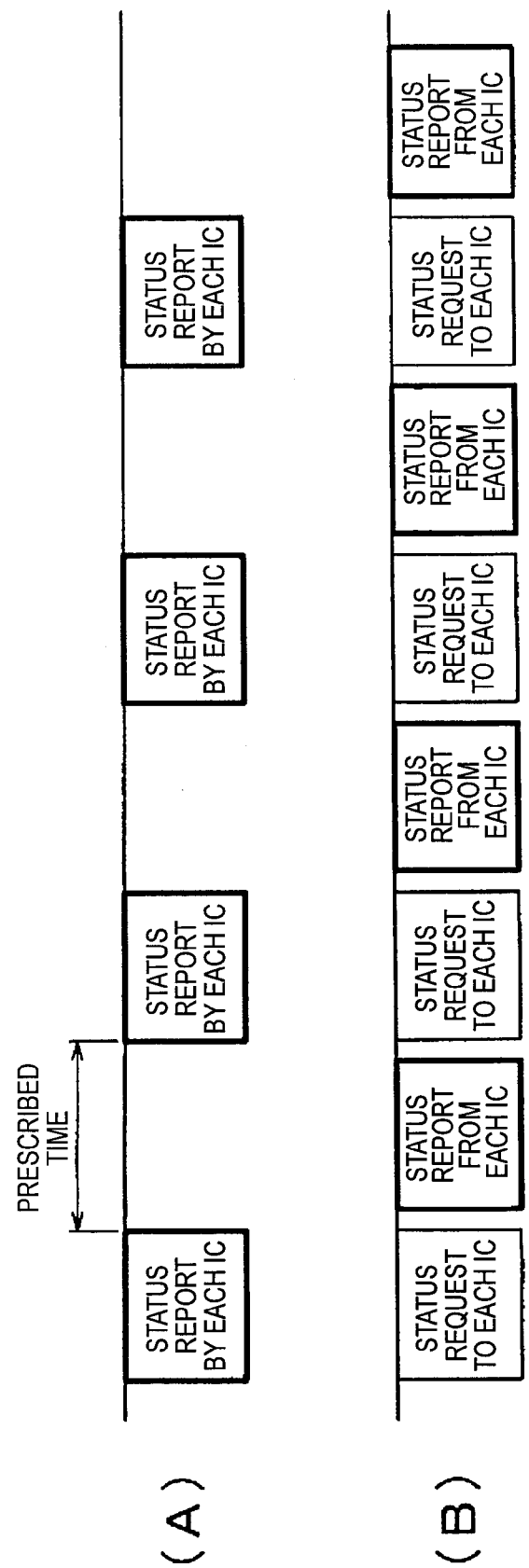
FIG. 7 is a timing chart of signals transmitted from the voltage detecting circuit IC to the low-voltage microprocessor.

Referring again to FIG. 5, the high-voltage microprocessor 72 of the voltage detecting circuits IC51 to IC55, when having counted for the prescribed time interval after the abnormal condition report processing is completed (when "Yes" in step S25), goes back to step S21 if the ignition switch is not turned on (when "No" in step S26). Thus, as indicated by (A) of FIG. 7, a status report including information such as the voltage value and the result signal S6 is sent from the voltage detecting circuits IC51 to IC55 at intervals of the prescribed time. If the ignition switch is turned on (when "Yes" in step S26), the high-voltage-related processing is ended. Meanwhile, the low-voltage microprocessor 60, as shown in FIG. 4, receives the information such as the result signal S6 and the voltage values sent from the voltage detecting circuits IC51 to IC55 (step S11 in the flow chart of FIG. 4). The low-voltage microprocessor 60 terminates the low-voltage-related processing when the ignition switch is turned on (when "Yes" in step S12).

According to the above-described battery monitoring device, the OR gate 74, which is provided at the branchpoint of the main line BLr and the branching lines BLr1 to BLr5, outputs on the main line BLr a signal indicating the occurrence of the abnormal condition when at least one of the result signals S1 to S5 output by the voltage detecting circuits IC51 to IC55 has the signal level indicating the occurrence of the abnormal condition. The OR gate 74 outputs the result signal S6 on which the result signals S1 to S5 are superimposed. Thus, when compared with transmission of the result signals S1 to S5 one at a time, the amount of data required can be reduced. According to this embodiment, the amount of data to be transmitted can be reduced to a one fifth. Also, by providing the result signals S1 to S5 that indicate the flags F1 to F4 in a predetermined sequence according to the types of the abnormal conditions, such that one and the only one combination of the signal level indicative of the presence of the abnormal condition and the signal level indicative of absence of abnormal condition is applied to all types of the abnormal conditions, the results of detection of the different types of the abnormal conditions can be transmitted to the low-voltage microprocessor 60 without providing the logic gates (AND circuits and OR circuits) on a per-abnormal-condition-type basis. Thus, while ensuring reduction in the amount of data to be transmitted as well as the manufacturing cost, the abnormal conditions of different types can be transmitted from the plurality of the voltage detecting circuits IC51 to IC55 to the low-voltage microprocessor 60.

In addition, according to the above-described battery monitoring device, in order to lower the breakdown voltage of the device, the voltage detecting circuits IC51 to IC55 are only driven by the power supplied from the unit cells s1 to sn of the corresponding battery blocks B1 to B5. According to this configuration, the battery blocks B1 to B5 can have the different ground levels, which causes the voltage level of the result signals S1 to S5 to differ according to the battery blocks B1 to B5. To compensate for the above, the battery monitoring device according to this embodiment includes the insulating interfaces IF1 to IF5 provided on the branching lines BLr1 to BLr5. By virtue of the insulating interfaces IF1 to IF5, the result signals S1 to S5 that are output by the voltage detecting circuits IC51 to IC55 can be sent to the OR gate 74 with the same voltage level shared by the result signals S1 to S5. Consequently, the result of detection indicating the occurrence of abnormal conditions can be output on the main line BLr if any one of the result signals output by the voltage detecting circuits IC51 to IC55 has the signal level indicating the occurrence of the abnormal condition, while making the circuit configuration simple and ensuring required degrees of the breakdown voltage of the voltage detecting circuits IC51 to IC55.

In the above-described embodiment, since the plurality of voltage detecting circuits IC51 to IC55 are only driven by the power supplied from the unit cells s1 to sn of their corresponding battery blocks B1 to B5, respectively, therefore the insulating interfaces IF1 to IF5 are provided on the branching lines BLr1 to BLr5. Nevertheless, this does not exclude other possible implementation of the present invention. For example, if the ground levels of the voltage detecting circuits IC51 to IC55 are identical, the insulating interfaces can be provided on the main lines BLr and BLt in the same way as in a conventional battery monitoring device.

Figure 8:
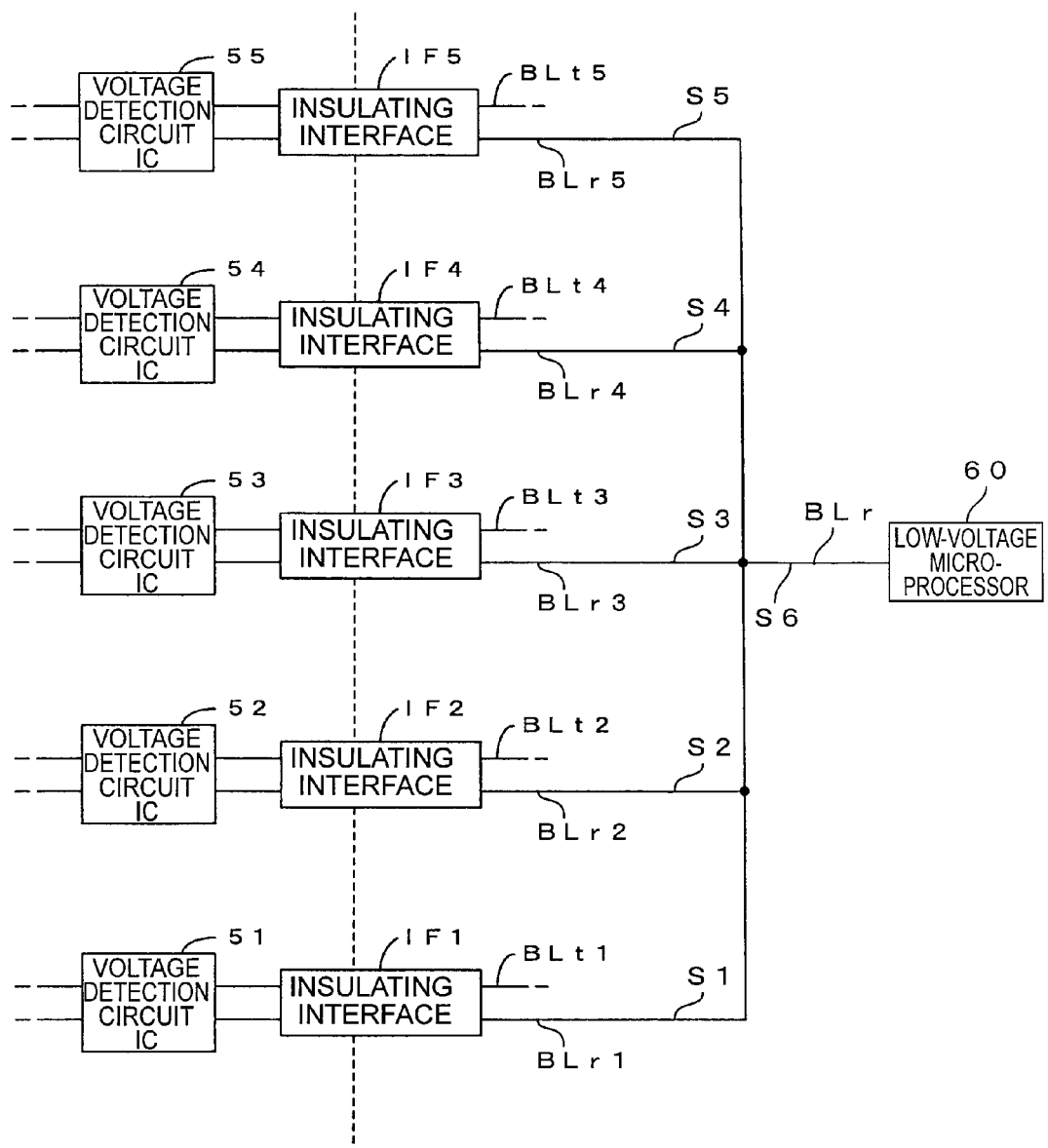
FIG. 8 is a circuit diagram illustrating another embodiment of the battery monitoring device incorporating the abnormal condition detection apparatus of the present invention.
Figure 9:
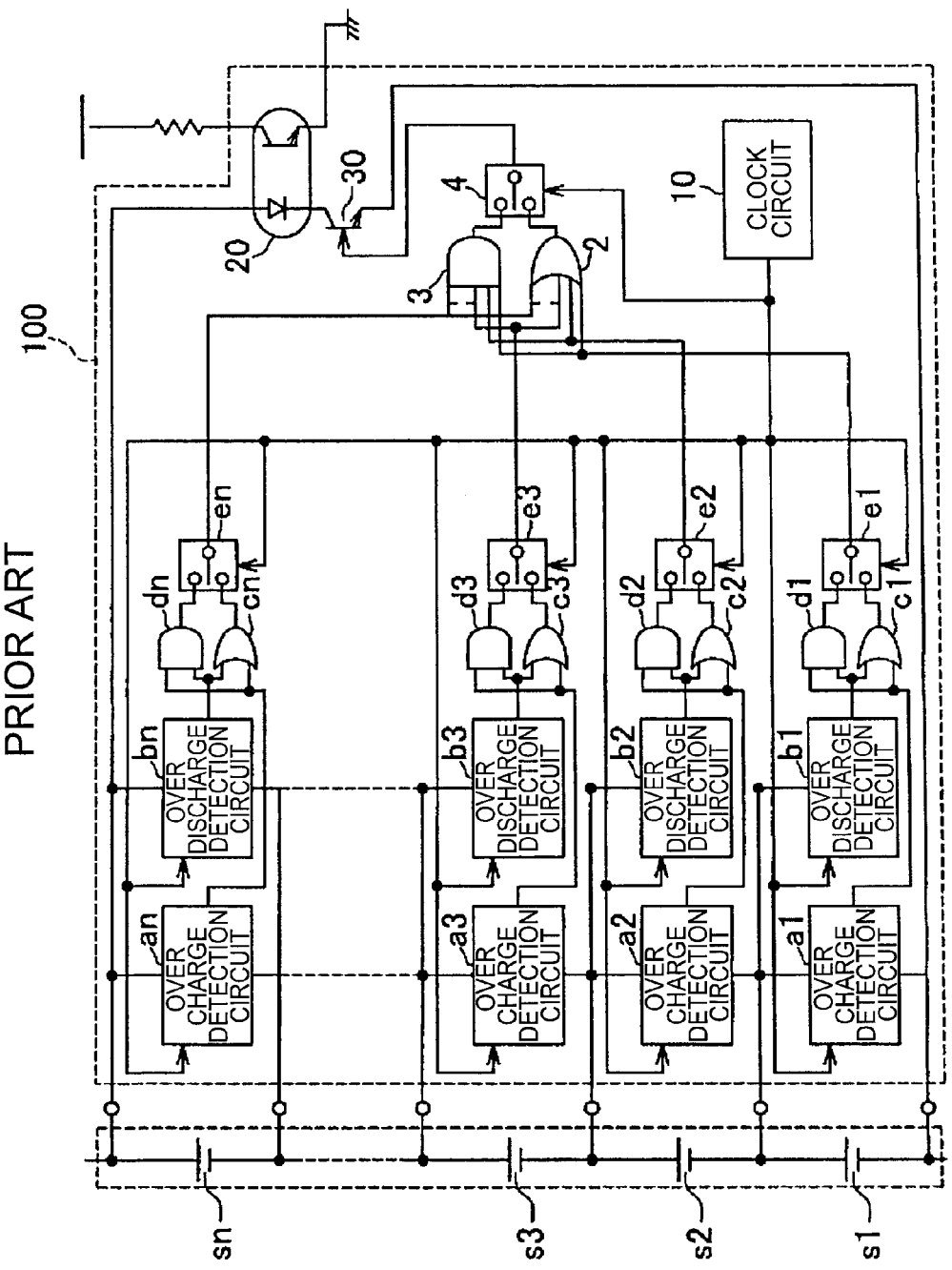
FIG. 9 is a block diagram of a conventional abnormal condition detection apparatus.

Although the above-described battery monitoring device has the OR gate 74, the battery monitoring device according to the present invention can be implemented without using the OR gate 74. As illustrated in FIG. 8, use of the result signals S1 to S5 that are driven low upon detection of the abnormal condition and driven and kept high when no abnormal condition is detected allows the low-level result signal S6 indicating the abnormal condition to be output on the main line BLr and transmitted to the low-voltage microprocessor when any one of the result signals S1 to S5 indicates the presence of the abnormal condition. In this case, the branching lines BLr1 to BLr5 will be simply connected to the main line BLr without the OR gate 74 provided at the branchpoint.

Also, in the battery monitoring device described above, the result signals S1 to S5 are driven low when abnormal condition is detected and are driven high and kept when abnormal condition is detected. The present invention of course allow a different approach. For example, the result signal S1 to S5 to be output may be such that result signal S1 to S5 are driven high when abnormal condition has been detected and driven low w when no abnormal condition has been detected. In this case, an AND gate should be provided in place of the OR gate 74.

In addition, according to the above-described battery monitoring device, as shown in FIG. 7A, the voltage detecting circuits IC51 to IC55 output the result signals S6 at prescribed time intervals in response to transmission of the clock signal. Another possibility is as follows. As shown in FIG. 7B, the low-voltage microprocessor 60 sends a request to send such status information to the voltage detecting circuits IC51 to IC55, and the voltage detecting circuits IC51 to IC55, upon receiving the request, outputs information such as the voltage value and the result signal S6 to the low-voltage microprocessor 60.

Having now fully described the invention, it is clear that the embodiment described above is illustrated as examples of the possible embodiments of the present invention, and that numerous modifications and variations can be effectuated within the spirit and scope of the present invention.

What is claimed is:

1. An abnormal condition detection apparatus comprising:
    a control unit;
    a plurality of abnormal condition detection units, each of said abnormal condition detection units being provided on each of corresponding battery blocks of a battery pack, each of said battery blocks having a plurality of unit cells connected in series, said unit cells being composed of a secondary cell, and each of said abnormal condition detection units detecting presence and absence of different types of abnormal conditions in said corresponding battery blocks comprising at least an abnormal condition related to battery charge, an abnormal condition occurring in a voltage detecting circuit, an occurrence of disconnection, and an abnormal condition related to analog-digital conversion;
    a plurality of output signals indicating a result of abnormal condition detection performed by each of said abnormal condition detection unit, each of said plurality of output signals being driven low when the abnormal condition is detected and driven high when no abnormal condition is detected, each of said plurality of output signals having a signal level indicative of the presence and the absence of all the different types of the abnormal conditions in a predetermined sequence comprising at least a signal level indicative of the presence and absence of the abnormal condition related to the battery charge followed by a signal indicative of the presence or absence and the abnormal condition related to the voltage detecting circuit, and each of said plurality of output signals being output simultaneously by said abnormal condition detection units;
a communication line including a main line connected to said control unit and branching lines connecting each of said abnormal condition detection units to said main line, said communication line being used to transmit each of said plurality of output signals; and
a logic gate that is provided at a branchpoint where said branching lines are connected to said main line, and outputs on said main line a result signal having the signal level indicative of the presence of each of the abnormal conditions via said main line to said control unit when any one of each of said output signals that have been output by said abnormal condition detection units has the signal level indicative of the presence of each of the abnormal conditions,
wherein each abnormal condition detection unit comprises selector switches, a differential amplifier, an analog-to-digital converter, and a high-voltage microprocessor
wherein the control unit provides a clock signal to each of the abnormal condition detection units, and each of the abnormal condition detection units detects the abnormal condition in response to an input of the clock signal and simultaneously outputs each of said output signals according to a count value of the clock signal.

2. An abnormal condition detection apparatus comprising:
a plurality of abnormal condition detection units, each of said abnormal condition detection units being provided on each of corresponding battery blocks of a battery pack, each of said battery blocks having a plurality of unit cells connected in series, said unit cells being composed of a secondary cell, and each of said abnormal condition detection units detecting presence and absence of different types of abnormal conditions in said corresponding battery blocks comprising at least an abnormal condition related to battery charge, an abnormal condition occurring in a voltage detecting circuit, an occurrence of disconnection, and an abnormal condition related to analog-digital conversion;
a result signal indicating a result of abnormal condition detection performed by said abnormal condition detection units, said result signal being driven low when the abnormal condition is detected and driven high when no abnormal condition is detected, said result signal having a signal level indicative of the presence and the absence of all the different types of the abnormal conditions in a predetermined sequence comprising at least a signal level indicative of the presence and absence of the abnormal condition related to the battery charge followed by a signal indicative of the presence and absence of the abnormal condition related to the voltage detecting circuit, and said result signal being output simultaneously by said abnormal condition detection units;
a control unit that receives said result signal; and
a communication line including a main line connected to said control unit and branching lines connecting each of said abnormal condition detection units to said main line, said communication line being used to transmit said result signal,
wherein each abnormal condition detection unit comprises selector switches, a differential amplifier, an analog-to-digital converter, and a high-voltage microprocessor
wherein the control unit provides a clock signal to each of the abnormal condition detection units, and each of the abnormal condition detection units detects the abnormal condition in response to an input of the clock signal and simultaneously outputs the result signal according to a count value of the clock signal.

3. An abnormal condition detection apparatus comprising:
a control unit;
a plurality of abnormal condition detection units, each of said abnormal condition detection units being provided on each of corresponding battery blocks of a battery pack, each of said battery blocks having a plurality of unit cells connected in series, said unit cells being composed of a secondary cell, and each of said abnormal condition detection units detecting presence and absence of different types of abnormal conditions in said corresponding battery blocks comprising at least an abnormal condition related to battery charge, an abnormal condition occurring in a voltage detecting circuit, an occurrence of disconnection, and an abnormal condition related to analog-digital conversion;
a plurality of output signals indicating a result of abnormal condition detection performed by each of said abnormal condition detection unit, each of said plurality of output signals being driven high when the abnormal condition is detected and driven low when no abnormal condition is detected, each of said plurality of output signals having a signal level indicative of the presence and the absence of all the different types of the abnormal conditions in a predetermined sequence comprising at least a signal level indicative of the presence and absence of the abnormal condition related to the battery charge followed by a signal indicative of the presence or absence and the abnormal condition related to the voltage detecting circuit, and each of said plurality of output signals being output simultaneously by said abnormal condition detection units;
a communication line including a main line connected to said control unit and branching lines connecting each of said abnormal condition detection units to said main line, said communication line being used to transmit each of said plurality of output signals; and
a logic gate that is provided at a branchpoint where said branching lines are connected to said main line, and outputs on said main line a result signal having the signal level indicative of the presence of each of the abnormal conditions via said main line to said control unit when any one of each of said output signals that have been output by said abnormal condition detection units has the signal level indicative of the presence of each of the abnormal conditions,
wherein each abnormal condition detection unit comprises selector switches, a differential amplifier, an analog-to-digital converter, and a high-voltage microprocessor
wherein the control unit provides a clock signal to each of the abnormal condition detection units, and each of the abnormal condition detection units detects the abnormal condition in response to an input of the clock signal and simultaneously outputs each of said output signals according to a count value of the clock signal.

4. The abnormal condition detection apparatus as recited in either of claim 1, 2, or 3, wherein each of said abnormal condition detection units is only driven by power supplied from the unit cells of each of said corresponding battery blocks, and a plurality of insulating interfaces are provided on each of said branching lines and used to connect said abnormal condition detection units to said control unit while electrically insulating therebetween.

\* \* \* \* \*